United States Patent
Jacquet et al.

(10) Patent No.: US 7,109,541 B2
(45) Date of Patent: Sep. 19, 2006

(54) INTEGRATED CIRCUIT COMPONENT, PROTECTED AGAINST RANDOM LOGIC EVENTS, AND ASSOCIATED METHOD OF MANUFACTURE

(75) Inventors: Francois Jacquet, Froges (FR);
Phillipe Roche, Presles (FR);
Jeanne-Pierre Schoellkopf, Grenoble (FR)

(73) Assignee: STMicroelectronics, S.A., Montrouge (FR)

( * ) Notice: Subject to any disclaimer, the term of this patent is extended or adjusted under 35 U.S.C. 154(b) by 130 days.

(21) Appl. No.: 10/318,955

(22) Filed: Dec. 13, 2002

(65) Prior Publication Data
US 2003/0117199 A1    Jun. 26, 2003

(30) Foreign Application Priority Data
Dec. 13, 2001    (FR) .................................. 01 16072

(51) Int. Cl.
*H01L 21/70*    (2006.01)
(52) U.S. Cl. ...................... 257/296; 365/145; 257/295; 438/238

(58) Field of Classification Search .................. 327/51, 327/55, 57, 564–566; 365/145, 149; 257/E21.661, 257/E27.095, 295, 296; 438/238–239
See application file for complete search history.

(56) References Cited

U.S. PATENT DOCUMENTS

| | | | | |
|---|---|---|---|---|
| 5,327,376 A | * | 7/1994 | Semi | 365/154 |
| 5,536,674 A | | 7/1996 | Kosa et al. | 437/52 |
| 5,619,055 A | * | 4/1997 | Meguro et al. | 257/369 |
| 6,285,575 B1 | * | 9/2001 | Miwa | 365/145 |
| 6,656,801 B1 | * | 12/2003 | Corvasce et al. | 438/279 |

FOREIGN PATENT DOCUMENTS

| | | |
|---|---|---|
| EP | 0 838 852 A2 | 4/1998 |
| JP | 60011354 | 7/1986 |
| JP | 04149519 | 12/1993 |
| WO | WO 01/75973 A2 | 10/2001 |

OTHER PUBLICATIONS

French Search Report.

* cited by examiner

*Primary Examiner*—Dinh T. Le
(74) *Attorney, Agent, or Firm*—Lisa K. Jorgenson; P. G. Scott Born; Graybeal Jackson Haley LLP

(57) ABSTRACT

A component of an integrated circuit comprises a first capacitor and a second capacitor series-connected between a first node and a second node of the component. This has application to logic circuits and bistable circuits, for example, SRAM type memories, flip-flop trigger circuits, etc.

36 Claims, 4 Drawing Sheets

INTEGRATED CIRCUIT COMPONENT, PROTECTED AGAINST RANDOM LOGIC EVENTS, AND ASSOCIATED METHOD OF MANUFACTURE

CROSS-REFERENCE TO RELATED APPLICATIONS

The present application claims priority from French patent application No. 01 16072, filed Dec. 13, 2001, which is incorporated by reference.

BACKGROUND OF THE INVENTION

1. Field of the Invention

The invention relates generally to a component of an integrated circuit protected against random logic events and an associated method of manufacture. The component may be a storage cell, for example, a multipoint memory cell, a latch, RS or flip-flop type trigger circuit or an SRAM cell. The component may also be logic circuit, for example, a combinatorial logic circuit or a dynamic logic circuit.

Embodiments of the invention is particularly useful for the making of electronic devices whose components are designed with dimensions smaller than 0.25 µm.

2. Description of the Prior Art

The constant and gradual miniaturization of electronic circuits is giving rise to increasingly efficient and ever smaller circuits. This means, however, that the circuits are becoming increasingly sensitive to their external environment and especially to random logic events caused by an additional supply of energy from outside the circuit.

A random logic event is a momentary change in state or a transient state (voltage and/or current spike) at a point of an integrated circuit. By definition, a random event is unpredictable or barely predictable. Random logic events may have different origins. The consequences of a random logic event may be varied and their importance may be variable. In a memory, for example, a random logic event gives rise to a change in the contents of a memory cell which will have to be reprogrammed to recover its initial value.

A random logic event is induced, for example, by the impinging of a charged energy particle on a point of an integrated circuit. A random factor of this type is known as a "single event upset" or SEU.

This type of random factor was previously encountered in the context of outer-space applications where ionizing radiation is a major factor in the operation of integrated circuits. In civilian or terrestrial applications, the effects of ionizing radiation have hitherto been overlooked. This is no longer the case for integrated circuits whose components have dimensions smaller than 0.5 micrometers because the circuits become increasingly sensitive as their dimensions decrease.

A random logic event may also be induced by localized capacitive coupling between two layers of one and the same integrated circuit. The commonly used term here is "glitch" or "single event transient" (SET).

The impinging of an energy particle or the capacitive coupling between two layers gives rise to an addition of charge to the circuit. This generally results in a voltage or current spike at a point of the circuit (impact point in the case of an SEU, or a coupling point in the case of a glitch). The current or voltage variation is generally very brief. Its duration typically ranges from a few picoseconds to a few hundred picoseconds.

The current or voltage variation may have no effect on the circuit. However, it may give rise to a random logic event if the added charge is greater than the critical charge of the circuit.

The critical charge of a circuit is the minimum charge that must be added for a random logic event to appear, a random logic event being a change in logic state at a point of the circuit. The critical charge of a circuit is especially small as the technology used to make it is small. The circuits made in the smallest technologies (0.25 µm, 0.13 µm) are thus particularly sensitive to random events.

A bistable circuit is generally formed (FIG. 1) by two inverters 110, 120 connected head-to-tail. An input of the first inverter 110 and an output of the second inverter 120 constitute a first input point A of the bistable circuit. An output of the inverter 110 and an input of the inverter 120 constitute a second input point B of the bistable circuit.

The inverter 110, in a known way, comprises a P type transistor 112 and an N type transistor 114 connected in series; a first supply voltage VDD is applied to the source of the P type transistor and a second supply voltage (most usually a ground GND of the circuit) is applied to the source of the N type transistor, the drains of the two transistors are connected together to an output of the inverter 110 and the gates of the two transistors are connected together to an input of the inverter 110. The inverter 120 is made identically with two transistors 122, 124.

A bistable circuit of this kind is, for example, used for the making of a storage cell for a SRAM (also called a six-transistor cell). A cell of this kind comprises a bistable circuit (inverters 110, 120) and two access transistors 130, 140 (shown in dashes in FIG. 1) whose drains are connected respectively to the inputs/outputs A, B of the bistable circuit. The gates of the transistors 130, 140 are connected together to a common word line (FIG. 1). The source of the transistor 130 is connected to a bit line BIT-A and the source of the transistor 140 is connected to a bit line BIT-B.

The FIGS. 2, 3 are respectively a view in perspective and a top view of a known implementation of a six-transistor storage cell, which is made as follows on a P-type substrate comprising an N-type well.

First of all, the following diffusion zones are made at a first level: a diffusion zone 210 forming the drain/source channel of the P-type transistor 112, a diffusion zone 212 forming the channel of the P-type transistor 122, a diffusion zone 214 forming the channel of the N-type transistor 124 and the channel of the N-type access transistor 130, and a diffusion zone 216 forming the channel of the N-type transistor 114 and the channel of the N-type access transistor 140.

Then polysilicon zones are made at a second level: a zone 220 forming the common gate of the transistors 112, 114, a zone 222 forming the common gate of the transistors 122, 124, and two zones 224, 226 respectively forming the gates of the access transistors 130, 140.

Contacts (shown in the form of vertical bars in FIGS. 2, 3) and a first metal level M1 are then made to connect the different zones appropriately. A metal zone M1 230 is thus connected firstly to the polysilicon zone 220 by the contact 260 and, secondly, to the diffusion zones 212, 214 by the contacts 252, 250. Similarly, a metal zone M1 232 is connected to the polysilicon zone 222 by the contact 272 and to the diffusion zones 210, 216 by the contacts 256, 258. The metal zones 230, 232 in practice form the inputs/outputs A, B of the bistable circuit. Other metal zones M1 are added, firstly to connect the gates and the sources of the access transistors 130, 140 (zones M1 234, 238, 236, 240 and associated contacts 255, 263, 254, 262) or to power the sources of the transistors 112, 114, 122, 124 (zones M1 244, 246, 248, 242 and associated contacts).

Any component of an integrated circuit made by the smallest technologies is sensitive to random logic events. This is the case of a bistable circuit or any component comprising at least one bistable circuit: latch, RS or flip-flop type circuit, SRAM type memory cell, multipoint memory cell, etc. This is also the case with any dynamic logic circuit or any combinatorial logic circuit.

One solution to the problem of protecting a circuit against random events consists of increasing its critical charge.

The document "A Novel 0.20 mm. Full CMOS SRAM Cell Using Stacked Cross Couple with Enhanced Soft Error Immunity", Electron Devices Meeting, 1998. IEDM '98 Technical Digest., International, pages 205–209, 6–9 Dec. 1998 (hereinafter D1) shows that it is possible to protect a SRAM cell by adding a capacitor between the two inputs/outputs A, B, of the cell. The added capacitor has the advantage of increasing the critical charge of the memory cell which thus becomes less sensitive to random logic events.

According to D1, the added capacitor is connected between the two inputs/outputs A, B of the memory cell (FIG. 3 of D1). More specifically, the contact zone of the P-type transistor and of the N-type transistor of each inverter 110, 120 constitutes an electrode of the added capacitor.

According to D1, as compared with the process of manufacture of an unprotected memory cell, three additional process steps are needed to make the capacitor (FIGS. 6a to 6d of D1): the deposition of a TiN layer to form a first electrode of the capacitor, the deposition of a SiN layer to form the insulator of the capacitor, then the deposition of a TiN to form the second electrode of the capacitor. Thus a "stacked cross couple" is obtained.

One drawback of the storage cell of D1 is its dissymmetry, which favors one logic state of the cell rather than another.

Yet another drawback of the cell of D1 is the fact that, in setting the size of the capacitor its critical charge is fixed when it is being designed. It cannot be modified according to the conditions of use of the cell, depending, for example, on the medium in which the cell is used.

Applied to any other component (latches, logic circuits, etc.), the solution of D1 has the same advantages and the same drawbacks.

SUMMARY OF THE INVENTION

One aspect of the invention proposes a novel solution, without the drawbacks of the solution proposed by D1, for the protection of an integrated circuit component against random logic events by increasing its critical charge.

Another aspect of the invention proposes a component that is protected against random logic events and has a size (in terms of silicon surface area occupied and total volume of the circuit) that is identical to that of a corresponding unprotected component.

Another aspect of the invention proposes a component whose critical charge may be adjusted as a function of the use made of the circuit.

Thus, one embodiment of the invention relates to a component in an integrated circuit, comprising a first capacitor and a second capacitor series-connected between a first node and a second node of the component. Another embodiment of the invention relates to an integrated circuit comprising a component of this kind.

The use of two series-connected capacitors thus gives symmetry to the component.

The circuit, according to an embodiment of the invention, is improved by the addition of a control terminal connected to the common point of the first capacitor and the second capacitor.

The critical charge of the component in this case is fixed as a function of the capacitance of the capacitors, the potentials applied to the first node and the second node, and the fixed potential at the control terminal. It is then possible to fix the potential at the common point of the two capacitors from the exterior. This makes it possible to modulate the critical charge of the component as a function of the medium in which it is used (namely as a function of its use in terrestrial applications, space applications, etc.).

The component may be a dynamic logic circuit, a combinatorial logic circuit, or a state machine. In this case, the first node is, for example, a sensitive node of the component to be protected against the random events, and the second node is, for example, an input node of the component connected to a power supply voltage source or to ground.

The component may also be a storage cell, for example, one of the following types: a multipoint memory cell, a latch, RS or flip-flop type trigger circuit, or a SRAM cell. In this case, the component preferably comprises a bistable circuit comprising a first inverter and a second inverter connected head-to-tail between an input and an output of the bistable circuit. The first node and the second node are then preferably the input and the output of the bistable circuit; these two nodes that are particularly sensitive to random events.

If the component is a SRAM cell type component, it comprises, in addition to a bistable circuit, a first access transistor and a second access transistor, a channel of the first access transistor being connected to the input of the bistable circuit and a channel of the second access transistor being connected to the output of the bistable circuit, and a gate of the first access transistor and a gate of the second access transistor being connected together to a bit line associated with the storage cell.

According to one embodiment of an integrated circuit according to the invention, the integrated circuit comprises a substrate on which several active zones are made, these zones constituting at least one component and comprising a first metal interconnection level forming at least one connection between at least two active zones. The integrated circuit also comprises a first capacitor, a body of an external electrode of this first capacitor extending between the substrate and the first metal interconnection level along an axis substantially perpendicular to the substrate, the external electrode also forming a connection between at least two active zones of the integrated circuit.

The height of the first capacitor is smaller than a distance between the substrate and the first metal interconnection level.

The external electrode preferably comprises a body substantially shaped like a hollow tube closed by a bottom. Said bottom forms the connection between at least two active zones of the circuit. According to one embodiment, the body of the external electrode has an "L"-shaped section. According to another embodiment, the body of the external electrode has a rectangular section.

An internal face of the external electrode is coated with an insulating layer forming a dielectric of the first capacitor.

The insulating layer is coated with a metal layer forming an internal electrode of the first capacitor, the internal electrode and the external electrode being substantially concentric.

Preferably, the second capacitor is made so as to be substantially identical to the first capacitor. Thus a perfectly symmetrical component is obtained, and the manufacturing process is simplified.

The invention also relates generally to a method for making an integrated circuit, during which several appropriate active zones are made to obtain an SRAM type memory cell.

According to an embodiment of the invention, the following steps are then performed:

E1: the deposition of a metal layer, to form an external electrode of a first capacitor and to make an interconnection between several active zones, E2: the deposition of an insulating layer on an inner wall of the external electrode, E3: the deposition of a metal layer on the insulating layer, to make an internal electrode of the first capacitor.

Then, preferably, the following step E4 is performed:

E4: the making of a connection bar and of an associated interconnection layer to connect an as-yet-unconnected active zone.

BRIEF DESCRIPTION OF THE DRAWINGS

The invention and the advantages that flow from it shall appear more clearly from the following description of an exemplary embodiment of components or integrated circuits according to the invention. The description must be read with reference to be appended drawings, of which.

MORE DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

A first exemplary implementation of an embodiment of the invention (not shown) relates to the making of a combinatorial logic circuit or dynamic logic circuit protected against random events. As compared with an existing equivalent circuit, this circuit has two series-connected capacitors added between two sensitive nodes of the circuit, or else between a sensitive node and a power supply input terminal, or again between a sensitive node and a ground of the circuit.

Figure 4:
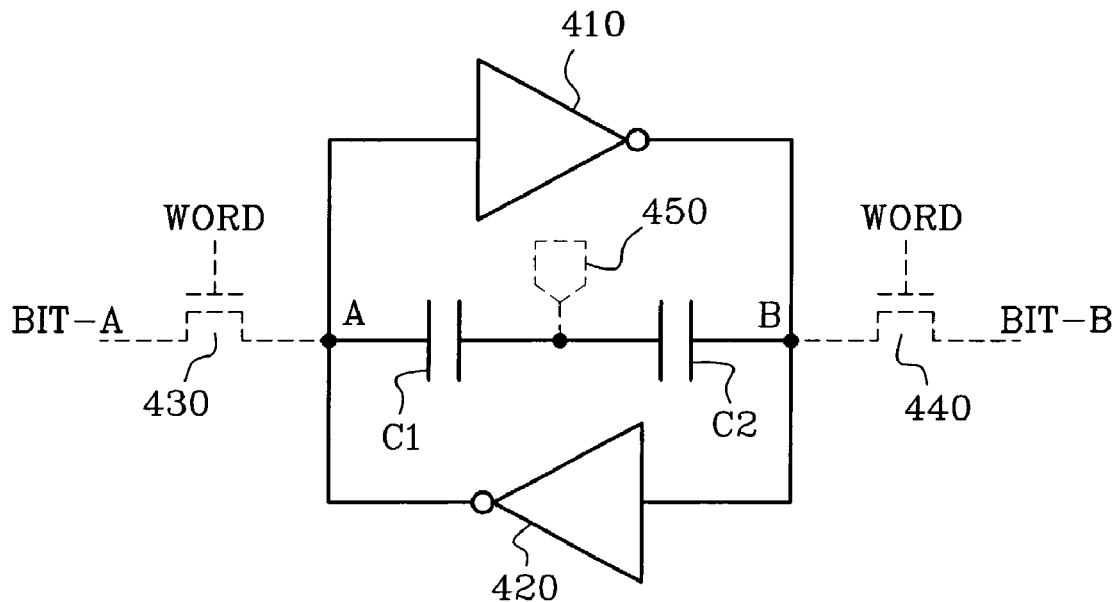
FIG. 4 is a schematic diagram of a bistable circuit according to an embodiment of the invention.
Figure 2:
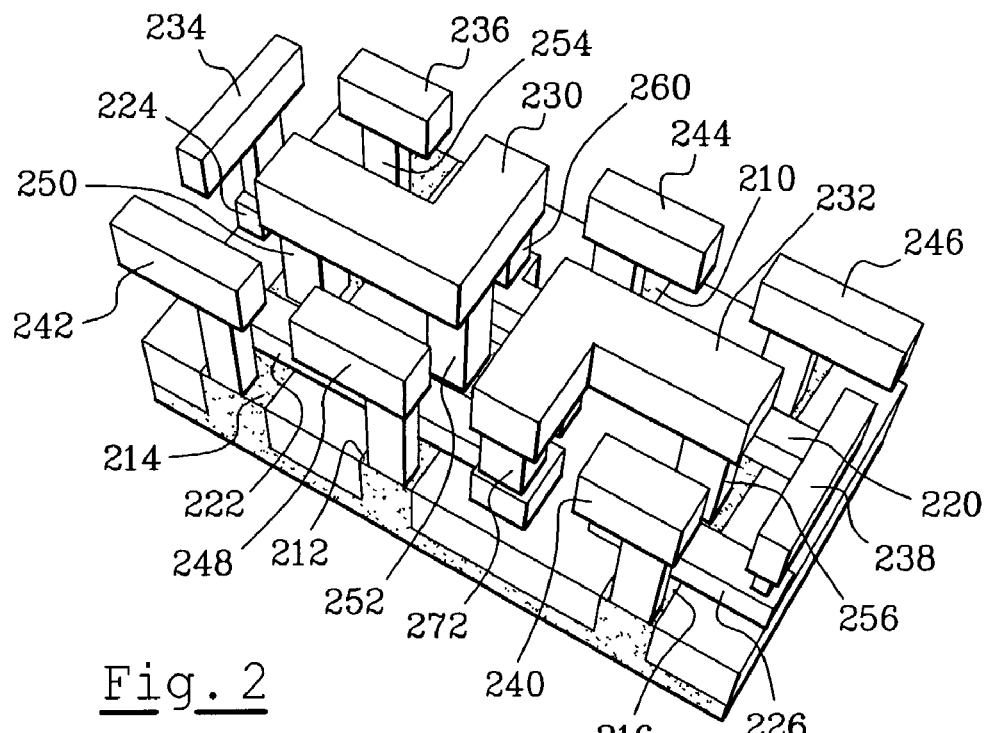
FIGS. 2, 3, already described, are a view, in perspective and a top view of an implementation of a known storage cell comprising a bistable circuit according to FIG. 1.
Figure 3:
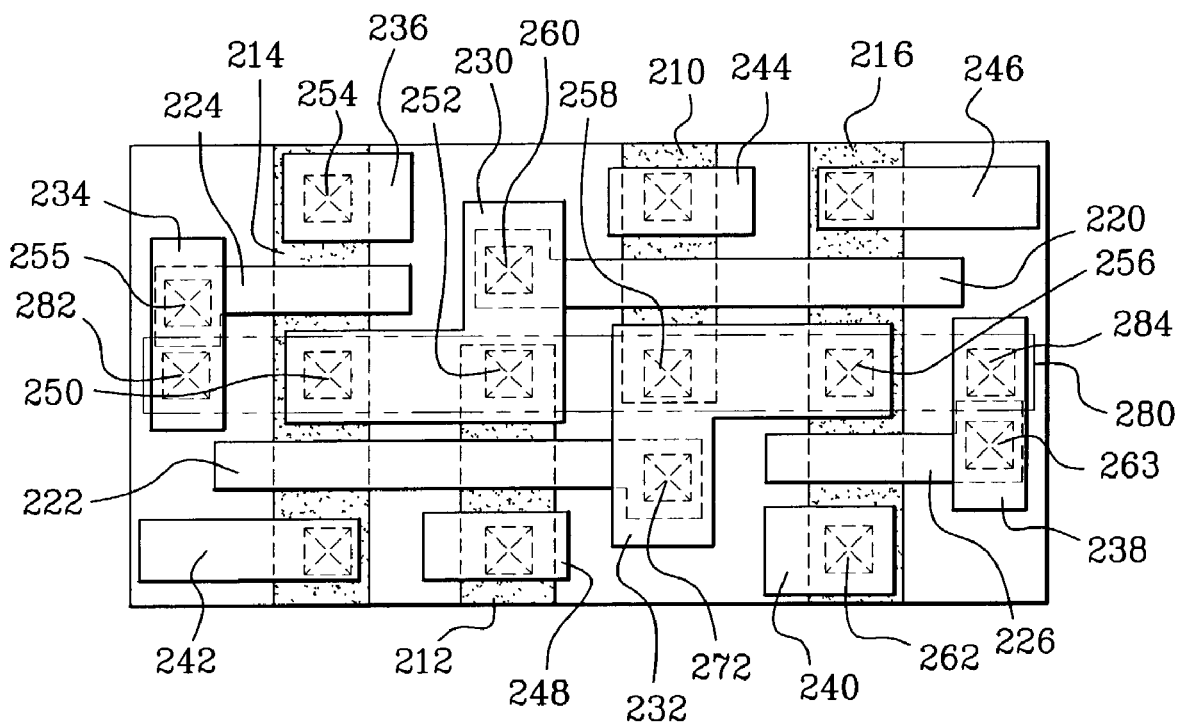

A second exemplary protected circuit according to an embodiment of the invention is a bistable circuit which, just like a known bistable circuit (FIG. 1), comprises (FIG. 4) two inverters 410, 420 connected head-to-tail between an input A and an output B of the bistable circuit.

A bistable circuit according to an embodiment of the invention is distinguished from a known bistable circuit by the addition of two capacitors C1, C2 series-connected between the input A and the input B of the bistable circuit. Naturally, the points A, B of the bistable circuit are symmetrical and, in practice, they form inputs/outputs of the circuit.

Figure 1:
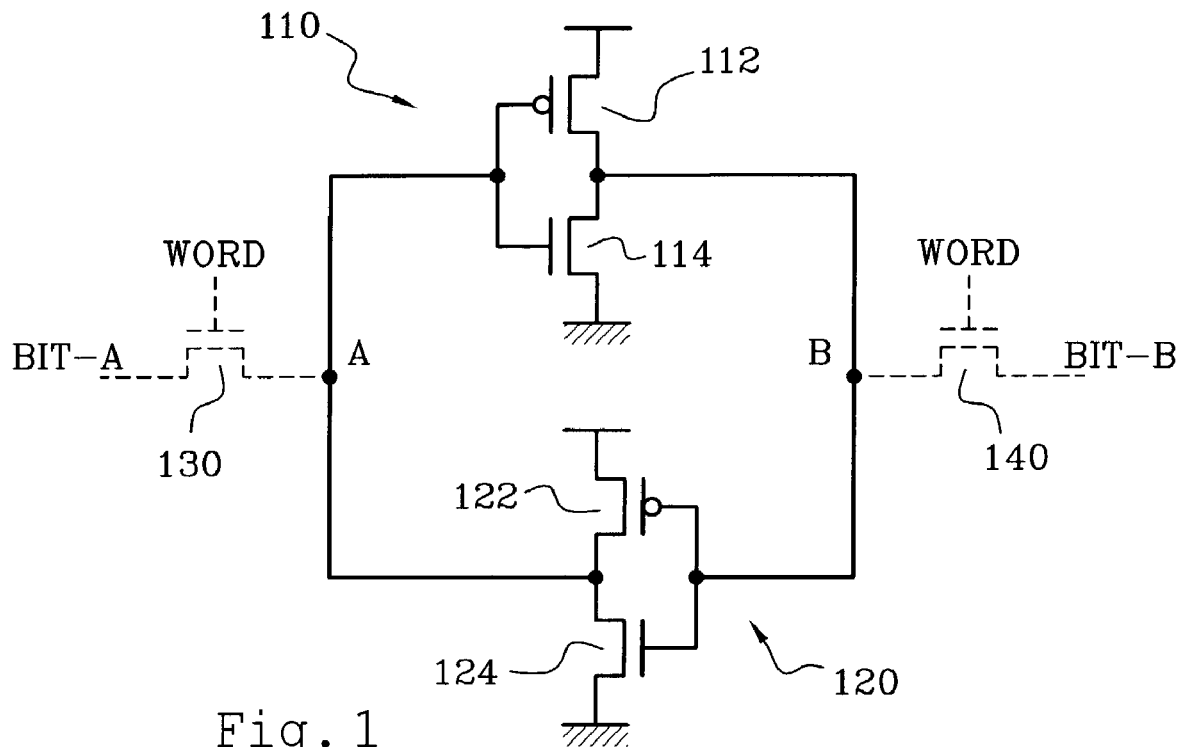
FIG. 1, already described, is an electronic diagram of a bistable circuit.

The inverters 410, 420 are made in the same way as the inverters 110, 120 of FIG. 1; each of them comprises a P-type transistor and an N-type transistor that are series-connected. A first power supply voltage VDD is applied to the source of the P-type transistor and a second power supply voltage (most usually a ground GND of the circuit) is applied to the source of the N-type transistor. The drains of the two transistors are connected together to an output of the inverter and the gates of the two transistors are connected together to an input of the inverter.

The capacitors are preferably but not restrictively chosen to be identical to provide symmetry to the circuit: the making of the circuit is thus facilitated and, from an electrical viewpoint, the behavior of the circuit is the same whatever its logic state in normal operation and/or in the presence of random logic events.

The common point of the two capacitors may be left floating, so that the potential at this point is fixed as a function of the potentials at the input A and at the output B. The critical charge of the bistable circuit, in this case, is fixed when the circuit is being made. It depends on the capacitance of the capacitor and on the potentials planned at the points A, B.

An input terminal 450 (shown in dashes in FIG. 4) may also be connected to the common point of the two capacitors C1, C2. The critical charge of the bistable circuit is fixed, in this case, as a function of the capacitance of the capacitors, the potentials applied to the points A, B, and the fixed potential at the input terminal 450.

A third exemplary circuit according to an embodiment of the invention is a storage cell. It is easily obtained from the bistable circuit of FIG. 4, by the addition of two access transistors 430, 440 (shown in dashes in FIG. 4). The gates of the transistors 430, 440 are connected to a word line WORD associated with the cell. The drain of the transistor 430 is connected to the input A and the drain of the transistor 440 is connected to the output B. The other connections of the transistors 430, 440 are standard ones and shall not be shown.

Figure 5:
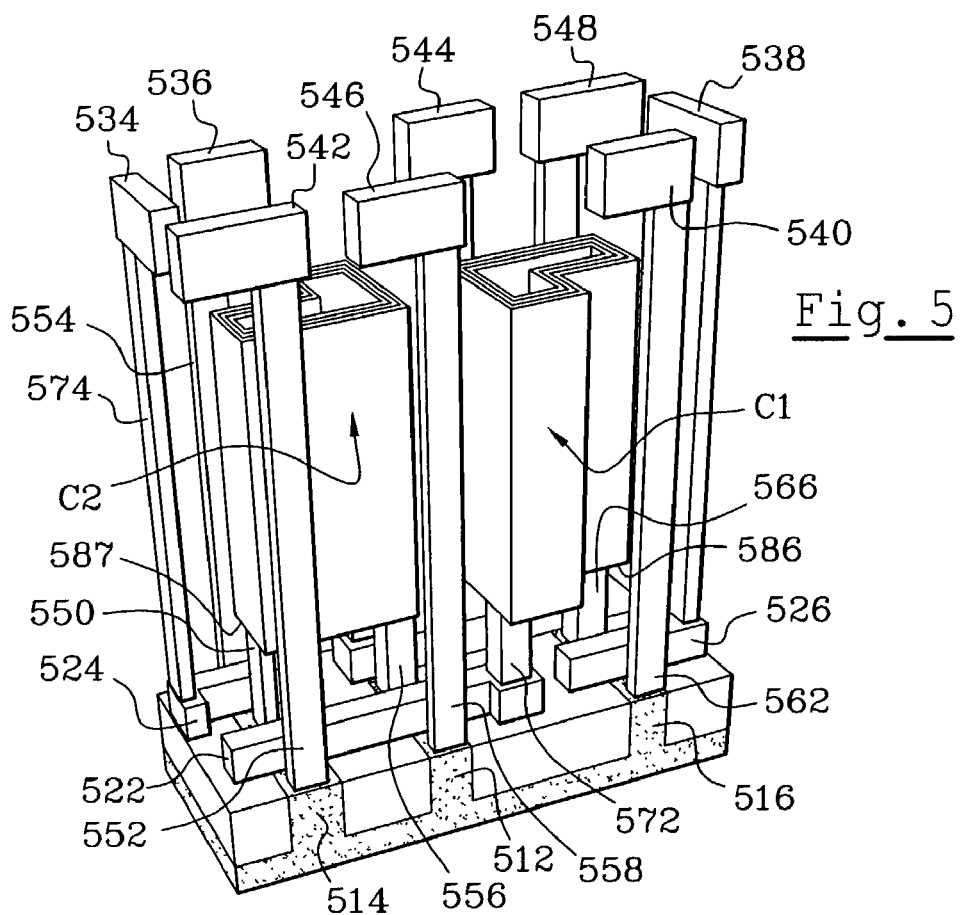
FIGS. 5, 6 are, respectively, a view in perspective and a top view of an exemplary implementation of a storage cell according to an embodiment of the invention.
Figure 6:
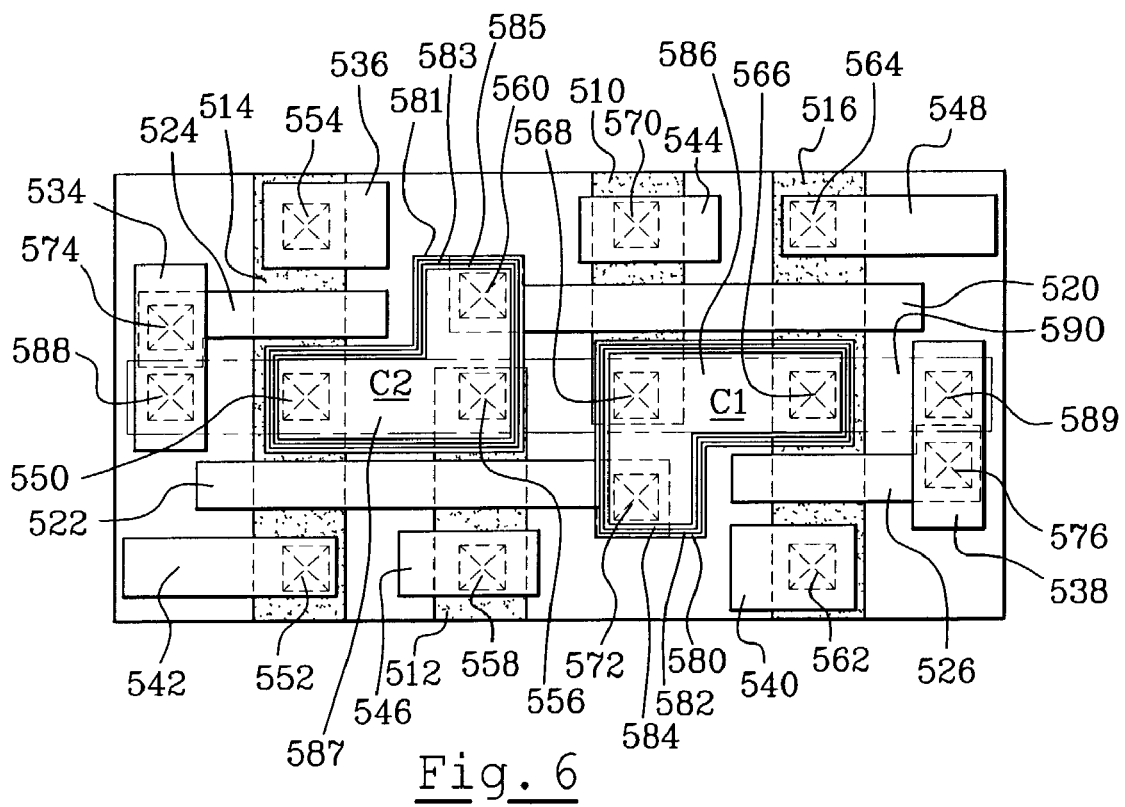

FIGS. 5, 6 are respectively a view in perspective and a top view of a possible implementation of six-transistor storage cell according to an embodiment of the invention, obtained as follows on a P-type substrate comprising an N-type well.

First of all, just as in the case of the known cell, the following are made at the first level: a diffusion zone 510, forming the drain/source channel of the P-type transistor of the inverter 410, a diffusion zone 512 forming the channel of the P-type transistor of the inverter 420, a diffusion zone 514 forming the channel of the N-type transistor of the inverter 420 and the channel of the N-type access transistor 430 and a diffusion zone 516 forming the channel of the N-type transistor of the inverter 410 and the channel of the N-type access transistor 440.

Then, polysilicon zones are made at a second level: a zone 520 forming the common gate of the P and N-type transistors of the inverter 410, a zone 522 forming the common gate of the P- and N-type transistors of the inverter 420, and two zones 524, 526 forming the gates of the access transistors 430, 440.

Contacts 568, 566, 572 are then made with a view to the connection of the diffusion zone 510, the diffusion zone 516 and the polysilicon zone 522 to an external electrode 580 of the capacitor C1. The common drains of the P- N-type transistors of the inverter 410, the common gates of the P, N type transistors of the inverter 420 and the drain of the transistor 440 will, thus, be connected together to the external electrode 580 of the capacitor C1.

Contacts 556, 550, 560 are made similarly with a view to the connection of the diffusion zone 512, the diffusion zone 514 and the polysilicon zone 520 to an external electrode 581 of the capacitor C2. The common drains of the P- and N-type transistors of the inverter 420, the common gates of the P- and N-type transistors of the inverter 410 and the drain of the transistor 430 will, thus, be connected together to the external electrode 581 of the capacitor C2.

Then, the capacitors C1, C2 are made according to an embodiment of the invention.

For this purpose, first of all the external electrodes 580, 581 of the capacitors C1, C2 are made: they have the shape of a hollow tube whose section is substantially "L"-shaped (in the example of FIGS. 5 and 6), and have one end closed by an electrode bottom 586, 587. Each electrode has a height H extending substantially perpendicularly to the plane of the substrate on which the cell is made. The electrodes are made, for example, of polysilicon.

The external electrodes 580, 581 are then coated on their inner wall with a thin layer 582, 583 of insulating oxide (for example nitrous oxide or Tantalum oxide (Ta 205)). The internal electrodes 584, 585 are then made by a polysilicon deposit on the internal wall of the insulating layers 582, 583. A contact (not shown in FIGS. 5, 6) is then made between the internal electrodes of the capacitors C1, C2, thus forming the common point of the two capacitors.

Contacts and a first metal level M1 are then made to connect and appropriately power the as-yet-unconnected zones, especially: the metal zone M1 536 and associated contact 554 are connected to the source of the transistor 430, the metal zone M1 544 and associated contact 570 are connected to the source of the P-type transistor of the inverter 410, the metal zone M1 548 and associated contact 564 are connected to the source of the N-type transistor of the inverter 410, the metal zone M1 542 and associated contact 552 are connected to the source of the N-type transistor of the inverter 420, the metal zone M1 546 and associated contact 558 are connected to the source of the P-type transistor of the inverter 420, the metal zone M1 540 and associated contact 562 are connected to the source of the transistor 440. The metal zone M1 534 and associated contact 574 are connected to the gate of the access transistor 430, and the metal zone M1 538 and associated contact 576 are connected to the gate of the access transistor 440.

A word line 590 is finally made on a metal level M2, and is connected to the metal zones M1 534, 538 by contacts 588, 589. The gates of the access transistors 430, 440 are, thus, connected to the bit line 590. For the sake of clarity, the word line 590 is not shown in FIG. 5 but only in FIG. 6.

As can be clearly seen in all the figures, a cell according to an embodiment of the invention can be made in the same size (in terms of total volume of the cell and/or of surface area occupied on the substrate) as a prior art equivalent cell. To this end, it is enough to make capacitors of adequate height. The height of the capacitors is chosen in practice according to the technology used to make the cell, the power supply voltages to be applied to the cell, the total height desired for the cell and constraints related to the imperatives of electrical insulation between the different elements of the cell. For example, a certain distance is typically kept between the gates of the transistors and the bottom of the external electrodes of the capacitors C1, C2. In the same way, a certain distance must be kept between the external electrodes of the capacitors and the contact elements that surround them or else between the electrodes and the metal level M1.

Figure 7:
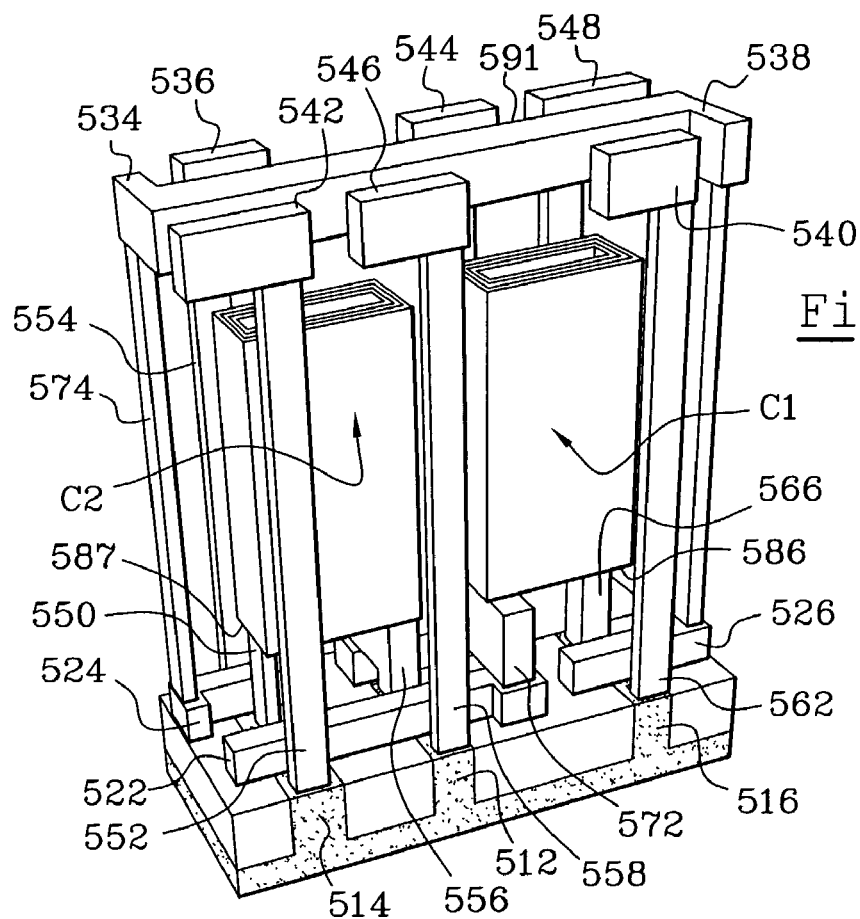
FIGS. 7, 8 are, respectively, a view in perspective and a top view of another exemplary implementation of a storage cell according to an embodiment of the invention.
Figure 8:
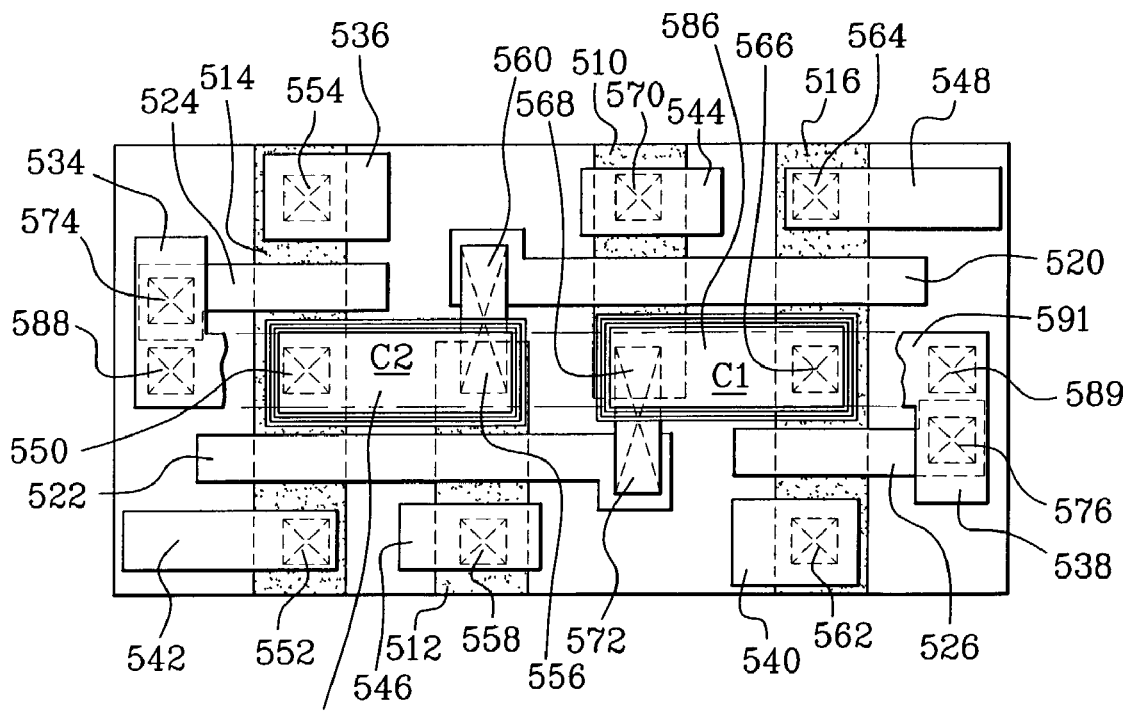

FIGS. 7, 8 show a variant of the memory cell of FIGS. 5, 6 according to another embodiment of the invention. Those elements of FIGS. 5, 6, 7, 8 that have the same references are identical.

The cell of FIGS. 7, 8 differs from that shown in FIGS. 5, 6 in the following ways:

The shape of the capacitors C1, C2 is similar but their section here is substantially rectangular. More generally, the shape of the sections may be chosen so as to occupy a maximum space within the cell (to make capacitors having the greatest possible capacitance) while at the same time maintaining sufficient electrical security distances between the different elements (especially the contacts) of the cell.

The separate contacts 568 and 572 (FIGS. 5 and 6) have been replaced by a single contact 568, 572, to connect the diffusion zone 510 and the polysilicon zone 522 together to the external electrode 580 of C1. This results from the choice made for the section of the capacitors.

The metal zones M1 534, 538 and the word line 590 at the metal level M1 are replaced by a single metal zone M1 591: the word line and the connections of the gates of the access transistors to this word line are, thus, made on a single metal connection level.

For a storage cell according to an embodiment of the invention, it is, thus, possible to reduce the total height of the cell as compared with that of an equivalent prior art cell. Indeed, as can be clearly seen in FIG. 5, the unoccupied space at the metal level M1 is sufficient to make the word line 590 at the metal level M1. As the case may be and as shown in FIG. 6, the contact zones 534, 538 and the word line 590 will be made in the form of one and the same piece of metal, thus, reducing the height and the total volume of the cell. However, this is not possible in a prior art cell because the word line is connected to a metal level M2, then to a metal level M3 above the metal level M1 for want of space.

In the embodiments described with reference to FIGS. 5 to 8, the cell has been made symmetrically. This ensures the complete electrical symmetry of the cell.

Finally, owing to the presence of capacitors fully integrated into a cell according to an embodiment of the invention, this cell has a critical charge that is increased as compared with that of a known cell.

As for the total size of the cell, in terms of silicon surface area and occupied volume, it is not increased.

In general, in the circuit according to various embodiments of the invention, the presence of capacitors increases the critical charge of the component and thus protects it from random logic events. Furthermore, the presence of two capacitors instead of only one makes it possible to obtain electrical symmetry for the resulting component (including the component to be protected and the capacitors) which cannot be obtained with only one capacitor. Indeed, the electrical and/or electrostatic influence of two capacitors can be distributed more easily on the entire component to which the two capacitors are connected. From the viewpoint of the practical making of the circuit, the capacitors may thus, for example, be drawn all around the component or else on either side of the component or else they may extend throughout the surface of the component, or else in a volume left free within the component (for example a SRAM cell).

In the examples of implementation of the invention, the capacitors were made identically and, as the case may be, symmetrically with each other in relation to an axis of symmetry of the component that they protect.

In practice, the shape of the capacitors is immaterial, and the two capacitors may be different from each other. The shape, size and position of each of the capacitors with respect to the component to be protected are thus chosen as a function of the shape and size of the component to be protected, the environment of the component (i.e. the surrounding components are taken into account), the electrical and electrostatic influence of the capacitors on the component itself and on its environment, the fact that the resulting component, comprising the component to be protected and the two capacitors, should be as symmetrical as possible from the electrical viewpoint in normal operation.

What is claimed is:

1. An integrated circuit, comprising:
a substrate;
a component, comprising,
   a first access node and a second access node,
   at least two active zones that are disposed in the substrate,
   a first conductive interconnection level disposed over the substrate;
   a first capacitor having a first electrode coupled to the first access node and having a second electrode, one of the first and second electrodes of the first capacitor disposed substantially normal to the substrate and between the substrate and the first conductive interconnection level;
   a second capacitor having a first electrode coupled to the second access node and having a second electrode; and
an external voltage-input terminal coupled to the second electrode of the first capacitor and to the second electrode of the second capacitor and operable to receive a voltage.

2. The integrated circuit of claim 1 wherein the component comprises a memory cell.

3. The integrated circuit of claim 1 wherein the first capacitor is identical to the second capacitor.

4. The integrated circuit of claim 1, further comprising a first access transistor having a source/drain node coupled to the first access node of the component.

5. The integrated circuit of claim 4, further comprising a second access transistor having a source/drain node coupled to the second access node of the component.

6. An integrated circuit according to claim 1 wherein the component comprises a bistable circuit including:
a first inverter having an input node coupled to the first access node of the component and having an output node coupled to the second access node of the component; and
a second inverter having an input node coupled to the second access node of the component and having an output node coupled to the first access node of the component.

7. An integrated circuit according to claim 6, wherein the component is a storage cell.

8. An integrated circuit according to claim 7, wherein the component is a storage cell of the multipoint memory type.

9. An integrated circuit according to claim 7, wherein the storage cell is a trigger circuit type of latch.

10. An integrated circuit according to claim 7, wherein the storage cell is a flip-flop circuit.

11. An integrated circuit according to claim 7, further comprising:
a word line; and
wherein the storage cell further comprises,
   a SRAM type storage cells,
   a first access transistor having a first channel connected to the first access node and having a gate connected to the word line, and
   a second access transistor having a second channel connected to the second access node and having a gate connected to the word line.

12. An integrated circuit according to claim 1, wherein the first electrode of the first capacitor also connects together the at least two active zones to form the first access node.

13. An integrated circuit according to claim 12, wherein a section of the first electrode is chosen so as to provide a maximum surface between the active zones and the conductive interconnection level.

14. An integrated circuit according to claim 13, wherein the capacitors increase a capacitance between the first access node and the second access node.

15. The integrated circuit of claim 1 wherein the first and second electrodes of the second capacitor are substantially normal to the substrate and are disposed between the substrate and the first conductive interconnection level.

16. An integrated circuit comprising:
a substrate; and
a component, comprising,
   first and second access nodes,
   at least two active zones disposed in the substrate,
   a first conductive interconnection level disposed over the substrate, and
   a first capacitor and a second capacitor series connected between the first and second access nodes, the first capacitor having a first electrode that is substantially perpendicular to the substrate, is disposed between the substrate and the first conductive interconnection level, and electrically connects the at least two active zones together, the first capacitor also including a second electrode that is coupled to a first electrode of the second capacitor.

17. An integrated circuit according to claim 16, further comprising a control terminal connected to the second electrode of the first capacitor.

18. An integrated circuit according to claim 16, wherein a section of the first electrode of the first capacitor is chosen so as to provide a maximum surface between the at least two active zones and the conductive interconnection level.

19. An integrated circuit according to claim 18, wherein a height of the first electrode is smaller than a distance between the substrate and the first conductive interconnection level.

20. An integrated circuit according to claim 18, wherein the first electrode is substantially shaped like a hollow tube closed by a bottom, said bottom forming the connection between the at least two active zones.

21. An integrated circuit according to claim 18, wherein the first electrode has an "L"-shaped section.

22. An integrated circuit according to claim 18, wherein the first electrode has a rectangular section.

23. An integrated circuit according to claim 18, wherein an internal face of the first electrode is coated with an insulating layer that forms a dielectric of the first capacitor.

24. An integrated circuit according to claim 23, wherein the first electrode is an external electrode of the first capacitor and the insulating layer is coated with a conductive layer forming an internal electrode of the first capacitor, the internal electrode and the external electrode being substantially concentric.

25. An integrated circuit according to claim 18, wherein the second capacitor is made substantially identically to the first capacitor.

26. An integrated circuit according to claim 18, wherein the component is a bistable circuit, wherein a bottom of the first electrode of the first capacitor forms the first access node, to which several active zones of the substrate are connected, and wherein a bottom of the first electrode of the second capacitor forms the second access node.

27. An integrated circuit comprising a component having at least two active zones disposed on a substrate,
   wherein the component further comprises a first capacitor having internal and external electrodes, one of the electrodes of the first capacitor extending substantially perpendicular to the substrate and between the substrate and a first conductive interconnection level disposed over the substrate, the external electrode also electrically connecting together the at least two active zones.

28. An integrated circuit according to claim 27, wherein a section of the external electrode is chosen so as to provide a maximum surface between the at least two active zones and the first conductive interconnection level.

29. An integrated circuit according to claim 28, wherein the height of the external electrode is smaller than a distance between the substrate and the first conductive interconnection level.

30. An integrated circuit according to claim 28, wherein the external electrode is substantially shaped like a hollow tube closed by a bottom, said bottom forming the connection between the at least two active zones of the circuit.

31. An integrated circuit according to claim 28, wherein the external electrode has an "L"-shaped section.

32. An integrated circuit according to claim 28, wherein the external electrode has a rectangular section.

33. An integrated circuit according to claim 28, wherein an internal face of the external electrode is coated with an insulating layer forming a dielectric of the first capacitor.

34. An integrated circuit according to claim 33, wherein the insulating layer is coated with a conductive layer forming the internal electrode of the first capacitor, the internal electrode and the external electrode being substantially concentric.

35. An integrated circuit according to claim 28, wherein the component comprises a second capacitor made substantially identically to the first capacitor.

36. An integrated circuit according to claim 28, wherein the component having the at least two active zones is a bistable circuit, wherein the bottom of the external electrode of the first capacitor forms a first input node of the bistable circuit, to which several active zones of the substrate are connected, and wherein the bottom of an external electrode of a second capacitor forms a second node of the bistable circuit.

* * * * *